United States Patent
Sunohara et al.

(10) Patent No.: US 12,482,691 B2
(45) Date of Patent: Nov. 25, 2025

(54) SUBSTRATE FIXING DEVICE

(71) Applicant: SHINKO ELECTRIC INDUSTRIES CO., LTD., Nagano (JP)

(72) Inventors: Masahiro Sunohara, Nagano (JP); Riku Nishikawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 296 days.

(21) Appl. No.: 18/330,613

(22) Filed: Jun. 7, 2023

(65) Prior Publication Data

US 2023/0402309 A1 Dec. 14, 2023

(30) Foreign Application Priority Data

Jun. 9, 2022 (JP) .................................. 2022-093894

(51) Int. Cl.
*H01L 21/683* (2006.01)

(52) U.S. Cl.
CPC ................. *H01L 21/6833* (2013.01)

(58) Field of Classification Search
CPC ........... H01L 21/6833; H01L 21/67103; H01L 21/6831; H01L 21/68757
See application file for complete search history.

(56) References Cited

U.S. PATENT DOCUMENTS

| 4,502,094 A * | 2/1985 | Lewin | .................. H01L 21/6831 |
| | | | 118/500 |
| 9,019,684 B2 * | 4/2015 | Kuribayashi | ....... H01L 21/6833 |
| | | | 361/234 |
| 2005/0215073 A1 * | 9/2005 | Nakamura | ........ H01L 21/67109 |
| | | | 438/778 |
| 2009/0061217 A1 * | 3/2009 | Silva | ...................... C01B 32/162 |
| | | | 428/688 |
| 2013/0155569 A1 * | 6/2013 | Suuronen | ............ H01L 21/6833 |
| | | | 361/234 |
| 2013/0321974 A1 | 12/2013 | Kuribayashi | |
| 2014/0063680 A1 * | 3/2014 | Fukasawa | ................ B05D 1/38 |
| | | | 361/234 |
| 2018/0374735 A1 * | 12/2018 | Fujita | ..................... H02N 13/00 |
| 2020/0161158 A1 * | 5/2020 | Liu | ........................ B23Q 3/152 |
| 2021/0268616 A1 * | 9/2021 | Sato | .................... H01L 21/6833 |

FOREIGN PATENT DOCUMENTS

JP 2013-247342 A 12/2013

* cited by examiner

*Primary Examiner* — Thienvu V Tran
*Assistant Examiner* — Muaamar Qahtan Al-Taweel
(74) *Attorney, Agent, or Firm* — Rankin, Hill & Clark LLP

(57) ABSTRACT

A substrate fixing device includes a base plate, a ceramic plate, and a thermal conduction member. The ceramic plate is bonded to the base plate via an adhesive layer, and has an electrode embedded therein for generating heat, and configured to adsorb a substrate by electrostatic force. The thermal conduction member is arranged in at least one of an adhesive surface of the ceramic plate, an adhesive surface of the base plate, and an inside of the adhesive layer, and having thermal conductivity in a stack direction of the base plate and the ceramic plate higher than thermal conductivity in a plane direction perpendicular to the stack direction.

7 Claims, 16 Drawing Sheets

SUBSTRATE FIXING DEVICE

CROSS-REFERENCE TO RELATED APPLICATIONS

This application is based on and claims the benefit of priority from prior Japanese patent application No. 2022-093894 filed on Jun. 9, 2022, the entire contents of which are incorporated herein by reference.

TECHNICAL FIELD

The present invention relates to a substrate fixing device.

BACKGROUND ART

In general, a substrate fixing device that adsorbs and holds a wafer when manufacturing a semiconductor component, for example, is also referred to as an electrostatic chuck (ESC), and includes a ceramic plate having an electrode embedded therein. The substrate fixing device has a structure in which the ceramic plate is bonded to a base plate, and applies a voltage to the electrode embedded in the ceramic plate, thereby adsorbing the wafer on the ceramic plate by using electrostatic force. By adsorbing and holding the wafer on the ceramic plate, processes such as microfabrication and etching on the wafer are efficiently performed.

In such substrate fixing device, a temperature control function may be provided to the ceramic plate in order to improve the thermal uniformity on the adsorption surface of the wafer. Specifically, in some cases, a heater electrode is formed by screen printing a metal paste, such as tungsten, and the heater electrode is fired simultaneously with the formation of the ceramic plate.

When the heater electrode is formed by the screen printing, a width and a thickness of the formed heater electrode may become non-uniform, and a temperature on the adsorption surface of the ceramic plate may not be sufficiently uniform. On the other hand, in order to obtain the high thermal uniformity on the adsorption surface of the ceramic plate, a technology of providing a concave portion in an adhesive surface of the ceramic plate to the base plate and filling the concave portion with a resin for temperature control having lower thermal conductivity than that of the ceramic plate is suggested.

CITATION LIST

Patent Literature

Patent Literature 1: JP2013-247342A

SUMMARY OF INVENTION

However, in the above technology, there are problems in that the transfer of heat from the ceramic plate to the base plate is inhibited by the resin for temperature control, resulting in non-uniformity in temperature of the adsorption surface of the ceramic plate and insufficient thermal uniformity.

Specifically, since the thermal conductivity of the resin for temperature control is lower than that of the ceramic plate, heat is not sufficiently transferred from the ceramic plate to the base plate at a position of the resin for temperature control while the heater electrode generates heat, resulting in a hot spot on the adsorption surface of the ceramic plate where a temperature is higher than those of other regions. As a result, the thermal uniformity on the entire adsorption surface of the ceramic plate may decrease.

Aspect of non-limiting embodiments of the present disclosure is to provide a substrate fixing device capable of obtaining sufficiently high thermal uniformity.

According to an aspect of the present disclosure, there is provided a substrate fixing device including a base plate, a ceramic plate, and a thermal conduction member. The ceramic plate is bonded to the base plate via an adhesive layer, has an electrode embedded therein for generating heat, and is configured to adsorb a substrate by electrostatic force. The thermal conduction member is arranged in at least one of an adhesive surface of the ceramic plate, an adhesive surface of the base plate, and an inside of the adhesive layer, and has thermal conductivity in a stack direction of the base plate and the ceramic plate higher than thermal conductivity in a plane direction perpendicular to the stack direction.

According to one aspect of the substrate fixing device, it is possible to achieve the effect of obtaining sufficiently high thermal uniformity.

DESCRIPTION OF EMBODIMENTS

Hereinafter, embodiments of a substrate fixing device and a manufacturing method of a substrate fixing device disclosed by the present disclosure will be described in detail with reference to the drawings. Note that the disclosed technology is not limited to the embodiments.

First Embodiment

Figure 1:
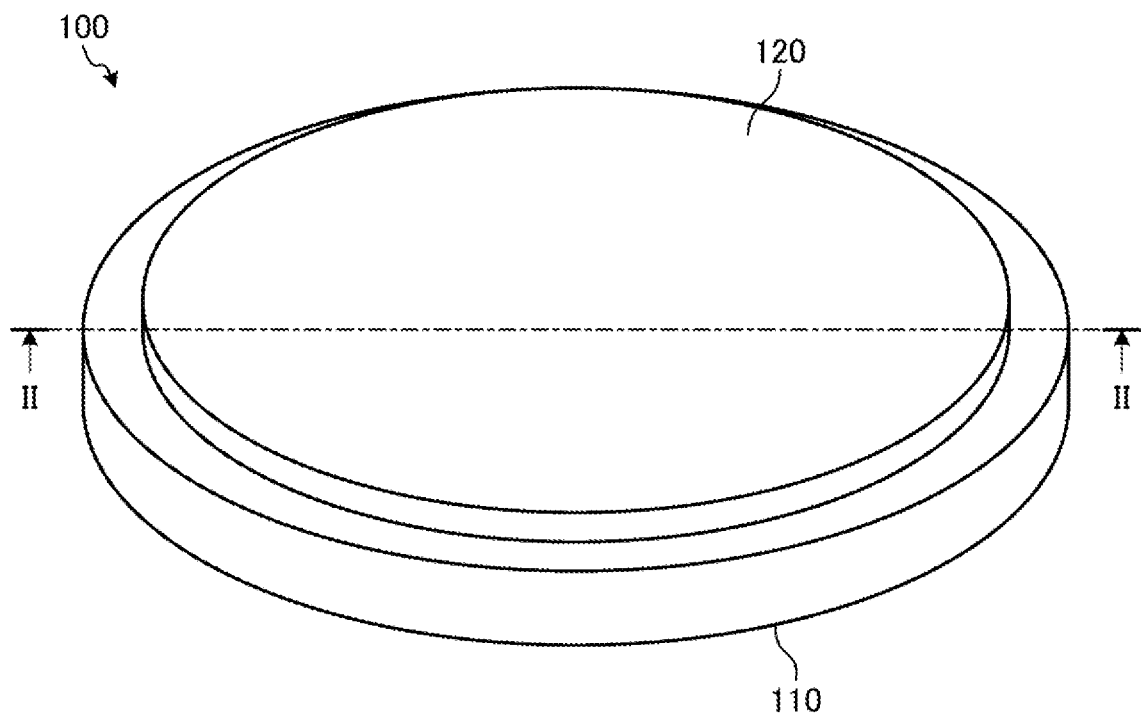
FIG. 1 is a perspective view showing a configuration of a substrate fixing device according to a first embodiment.

FIG. 1 is a perspective view showing a configuration of a substrate fixing device 100 according to a first embodiment. The substrate fixing device 100 shown in FIG. 1 has a structure in which a ceramic plate 120 is bonded to a base plate 110.

The base plate 110 is a circular member made of metal such as aluminum, for example. The base plate 110 is a base member for fixing the ceramic plate 120. The base plate 110 is attached to a semiconductor manufacturing apparatus, for example, and causes the substrate fixing device 100 to function as a semiconductor holding device for holding a wafer.

The ceramic plate 120 is a circular member made of insulating ceramic. A diameter of the ceramic plate 120 is smaller than a diameter of the base plate 110, and the ceramic plate 120 is fixed to a center of the base plate 110. That is, a lower surface of the ceramic plate 120 serves as an adhesive surface that is bonded to the base plate 110, and the adhesive surface is bonded to the base plate 110 by an adhesive layer made of, for example, silicone resin, so that the ceramic plate 120 is fixed. An upper surface of the ceramic plate 120 is, for example, an adsorption surface for adsorbing a target object to be adsorbed, such as a wafer.

The ceramic plate 120 has an electrically conductive electrode embedded therein, and adsorbs a target object such as a wafter to the adsorption surface by using electrostatic force that is generated when a voltage is applied to the electrode. In addition, the ceramic plate 120 has a heater electrode embedded therein, and adjusts temperatures of the ceramic plate 120 and the target object such as a wafer adsorbed on the ceramic plate 120 by the heater electrode that generates heat when a voltage is applied thereto.

Figure 2:
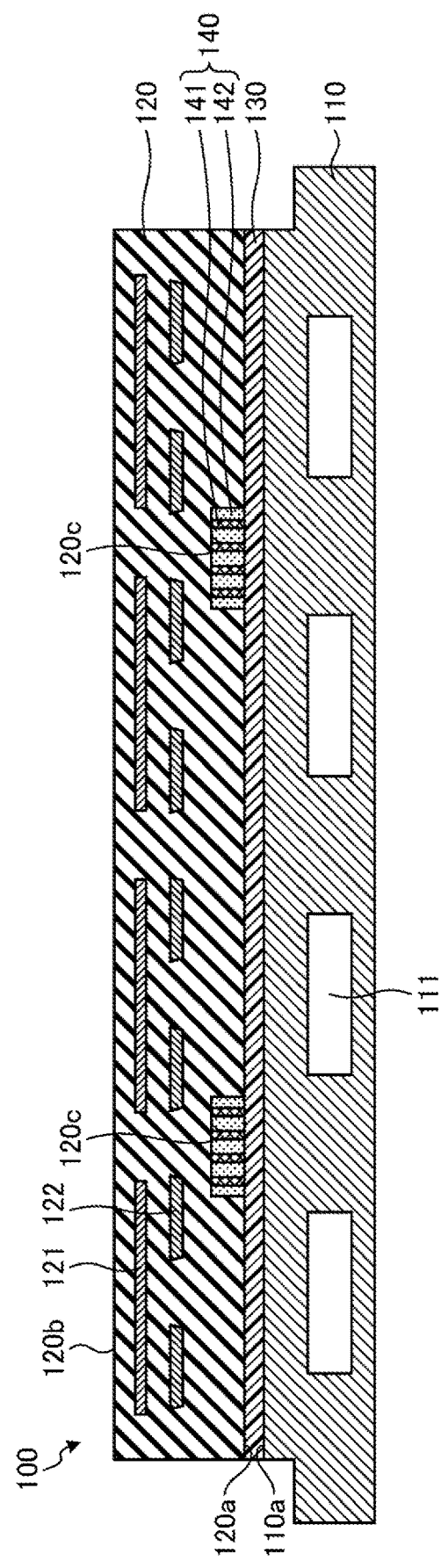
FIG. 2 is a schematic view showing a cross section of the substrate fixing device according to the first embodiment.

FIG. 2 is a schematic view showing a cross section of the substrate fixing device 100 according to the embodiment. In FIG. 2, a cross section taken along a line II-II in FIG. 1 is shown. As shown in FIG. 2, the substrate fixing device 100 has a configuration in which the base plate 110 and the ceramic plate 120 are bonded to each other by an adhesive layer 130.

The base plate 110 is a circular member made of metal and having a thickness of about 20 to 50 mm, for example. In the base plate 110, a refrigerant passage 111 serving as a passage for refrigerant such as cooling water or cooling gas is formed. The refrigerant passes through the refrigerant passage 111, so that the ceramic plate 120 are cooled. The ceramic plate 120 is cooled, so that the target object such as a wafer adsorbed on the adsorption surface of the ceramic plate 120 is cooled. An upper surface 110a of the base plate 110 is an adhesive surface bonded to the ceramic plate 120, and is bonded to a lower surface 120a of the ceramic plate 120 by the adhesive layer 130.

The ceramic plate 120 is a circular plate made of ceramic and having a thickness of 4 to 6 mm, for example. The ceramic plate 120 is obtained by, for example, firing a green sheet fabricated using aluminum oxide. The lower surface 120a of the ceramic plate 120 is an adhesive surface that is bonded to the base plate 110, and is bonded to the upper surface 110a of the base plate 110 by the adhesive layer 130. In the ceramic plate 120, an electrode 121 and a heater electrode 122 are formed.

The electrode 121 is arranged in the ceramic plate 120, and generates electrostatic force when a voltage is applied thereto. By the electrostatic force, the ceramic plate 120 adsorbs a target object such as a wafer to an upper surface 120b serving as an adsorption surface.

The heater electrode 122 is arranged below the electrode 121 in the ceramic plate 120, and generates heat when a voltage is applied thereto. Due to heat generated by the heater electrode 122, the ceramic plate 120 heats the ceramic plate 120 and the target object such as a wafer adsorbed on the upper surface 120b of the ceramic plate 120.

A concave portion 120c is formed in the lower surface 120a of the ceramic plate 120, and a thermal conduction member 140 is arranged in the concave portion 120c.

The thermal conduction member 140 has a property (hereinafter, appropriately referred to as 'thermal anisotropy') that thermal conductivity in a stack direction in which the base plate 110 and the ceramic plate 120 are stacked (which may also be simply referred to as 'stack direction', hereinafter) is higher than thermal conductivity in a plane direction perpendicular to the stack direction. Specifically, the thermal conduction member 140 has a structure in which a plurality of carbon nanotubes 141, each having thermal conductivity in a longitudinal direction higher than thermal conductivity in other directions, are embedded in a resin 142. The carbon nanotubes 141 are cylindrical crystals made of carbon, and are arranged such that the longitudinal direction faces toward the stack direction. The thermal conductivity of the carbon nanotubes 141 in the longitudinal direction is higher than that of the ceramic plate 120. The resin 142 covers the carbon nanotubes 141 in a state in which both end faces of the carbon nanotubes 141 in the longitudinal direction are exposed. As the resin 142, for example, a thermosetting resin such as an epoxy resin, a thermoplastic resin such as a polyethylene resin, or the like can be used.

By arranging the thermal conduction member 140 having thermal anisotropy in (the concave portion 120c in) the lower surface 120a of the ceramic plate 120, heat can be more smoothly transferred from the ceramic plate 120 to the base plate 110, as compared with a case in which a resin for temperature control is arranged. For this reason, it is possible to suppress generation of a hot spot on the adsorption surface (i.e., upper surface 120b) of the ceramic plate 120 where a temperature is higher than those of other regions. As a result, a temperature distribution on the adsorption surface of the ceramic plate 120 can be made uniform, and therefore, sufficiently high thermal uniformity can be obtained.

In addition, by arranging the carbon nanotubes 141 of the thermal conduction member 140 such that the longitudinal direction thereof faces toward the stack direction and covering the carbon nanotubes with the resin 142 in a state in which both end faces in the longitudinal direction are exposed, the heat can be smoothly transferred along the stack direction.

Figure 3:
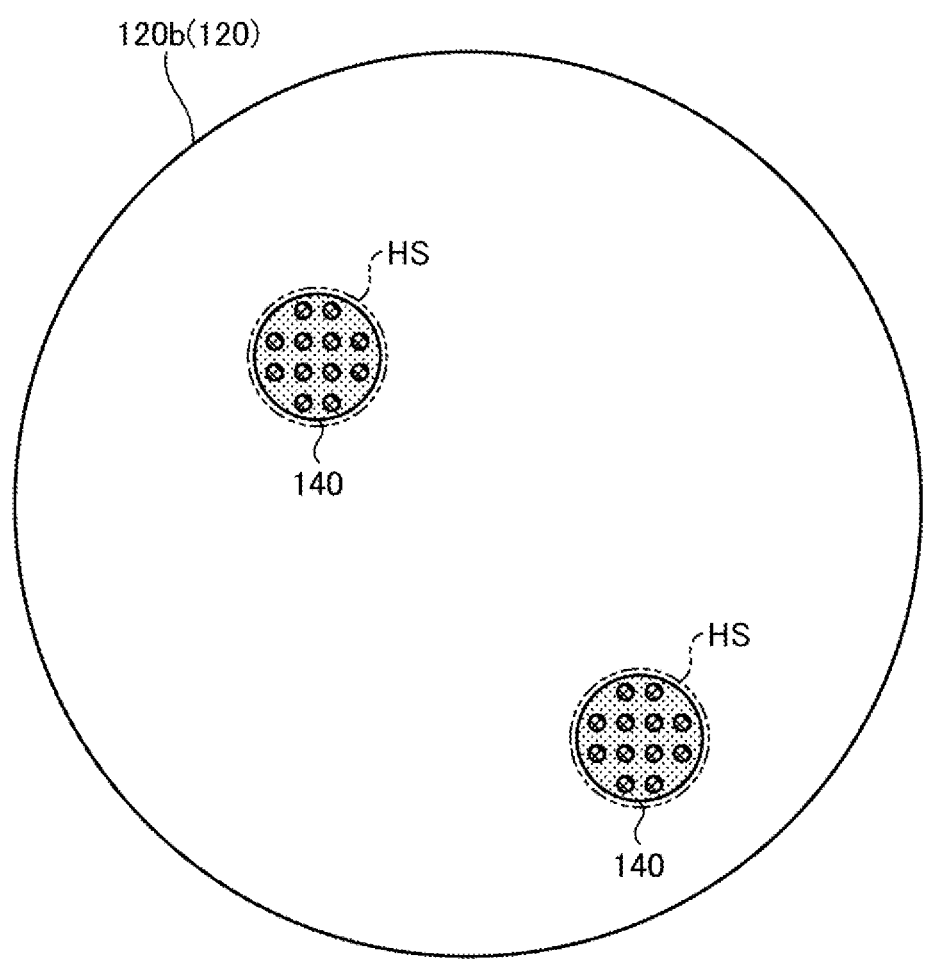
FIG. 3 shows a specific example of arrangement of a thermal conduction member.

Here, a specific example of arrangement of the thermal conduction member 140 will be described with reference to FIG. 3. FIG. 3 shows a specific example of arrangement of the thermal conduction member 140. In FIG. 3, the arrangement of the two thermal conduction members 140 shown in FIG. 2 is shown.

As shown in FIG. 3, the thermal conduction member 140 is arranged at a position overlapping a hot spot HS, which becomes a temperature singularity when the heater electrode 122 generates heat, on the adsorption surface (i.e., upper surface 120b) of the ceramic plate 120, in a plan view. That is, the lower surface 120a (refer to FIG. 2) of the ceramic plate 120 is formed with the concave portion 120c (refer to FIG. 2), in correspondence to the position of the hot spot HS, and the thermal conduction member 140 is arranged in the concave portion 120c. As described later, the hot spot HS is specified in advance by measuring a temperature distribution on the upper surface 120b of the ceramic plate 120 with a measurement device in a state in which a voltage is applied to the heater electrode 122.

In this way, the thermal conduction member 140 is arranged at a position overlapping the specified hot spot HS in a plan view, so that the heat can be smoothly transferred from the hot spot HS to the base plate 110, as compared with a case in which the thermal conduction member 140 and the hot spot HS do not overlap. As a result, since the hot spot HS can be cooled in a pinpoint manner by the base plate 110, the temperature difference on the adsorption surface of the ceramic plate 120 can be further reduced.

Description will return to FIG. 2. The adhesive layer 130 is a layer made of, for example, a silicone resin-based adhesive or an epoxy resin-based adhesive, and having a thickness of about 0.05 mm to 3.0 mm, for example, and bonds the lower surface 120a of the ceramic plate 120 to the upper surface 110a of the base plate 110.

Figure 4:
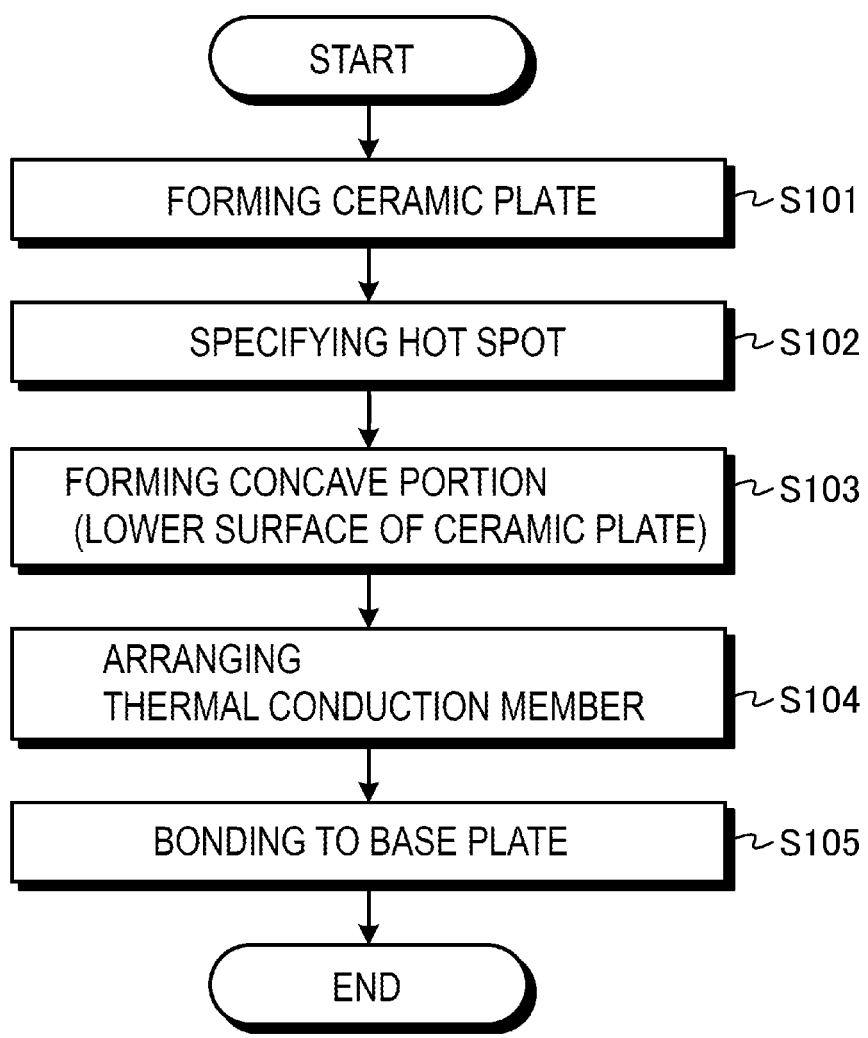
FIG. 4 is a flowchart showing a manufacturing method of the substrate fixing device according of the first embodiment.

Next, a manufacturing method of the substrate fixing device 100 configured as described above will be described with reference to FIG. 4. FIG. 4 is a flowchart showing a manufacturing method of the substrate fixing device 100 according of the first embodiment.

Figure 5:
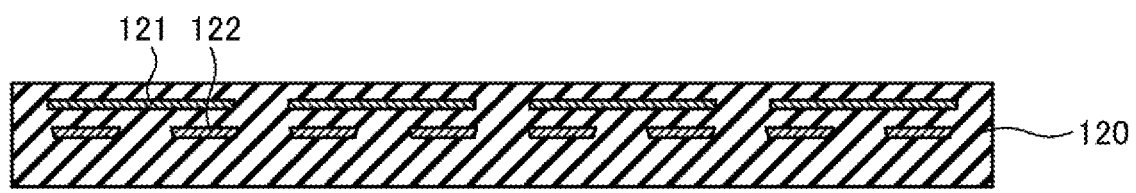
FIG. 5 shows a specific example of a ceramic plate.

First, a ceramic plate 120 for adsorbing a target object such as a wafer is formed (step S101). Specifically, a plurality of green sheets made of, for example, aluminum oxide as a main material are fabricated. An electrode 121 is appropriately formed on one surface of the green sheet, and a heater electrode 122 is formed on one surface of another green sheet. The electrode 121 and the heater electrode 122 may be each formed by screen printing a metal paste on the surface of the green sheet, for example. Then, a ceramic plate 120 is formed by stacking and firing the plurality of green sheets. The ceramic plate 120 has a layer of the electrode 121 and a layer of the heater electrode 122 embedded therein, as shown in FIG. 5, for example. FIG. 5 shows a specific example of the ceramic plate 120.

Figure 6:
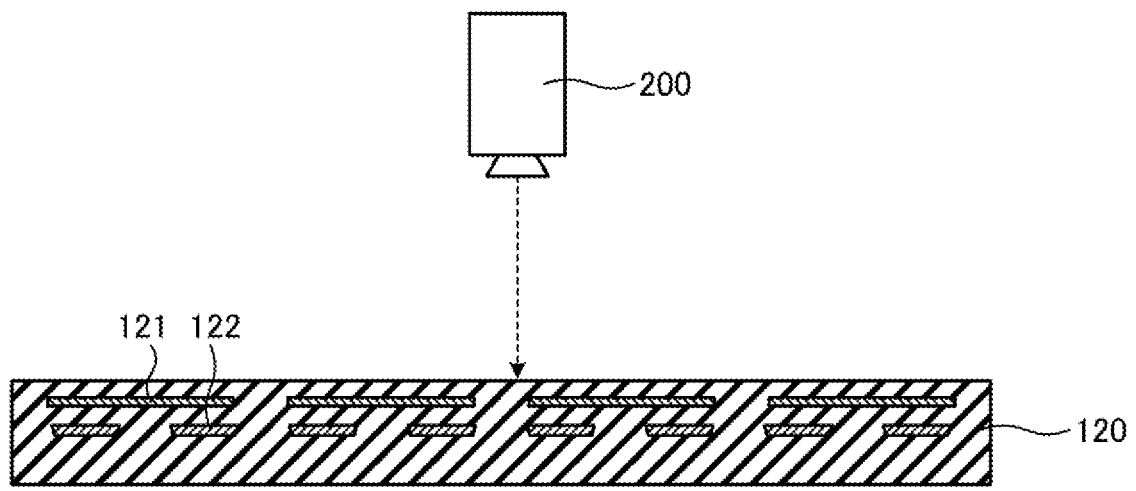
FIG. 6 shows a specific example of a hot spot specifying process.

When the ceramic plate 120 is formed, a hot spot on an adsorption surface of the ceramic plate 120 is specified (step S102). Specifically, for example, as shown in FIG. 6, the hot spot is specified using a measurement result obtained by measuring a temperature distribution on an upper surface 120b of the ceramic plate 120 with a measurement device 200 in a state in which a voltage is applied to the heater electrode 122. FIG. 6 shows a specific example of a hot spot specifying process. As the measurement device 200, a non-contact type thermometer such as an infrared camera can be used, for example. In addition, the measurement device 200 may be equipped with an arithmetic device such as a processor that specifies a hot spot by comparing a temperature distribution measurement result obtained from a non-contact thermometer such as an infrared camera with a predetermined threshold value.

Figure 7:
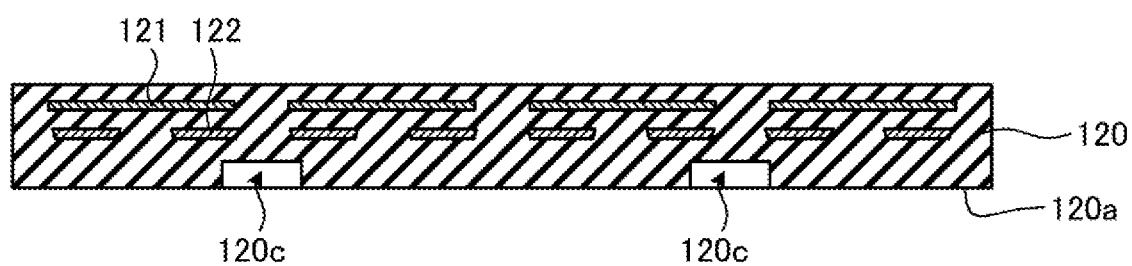
FIG. 7 shows a specific example of a concave portion forming process.

When the hot spot is specified, an adhesive surface (i.e., lower surface 120a) of the ceramic plate 120 is formed with a concave portion, in correspondence to a position of the hot spot (step S103). Specifically, for example, as shown in FIG. 7, the ceramic plate 120 is cut from the lower surface 120a side to a position that does not reach the heater electrode 122, resulting in the formation of the concave portion 120c. FIG. 7 shows a specific example of a concave portion forming process. The concave portion 120c is formed by laser processing or drilling, for example.

Figure 8:
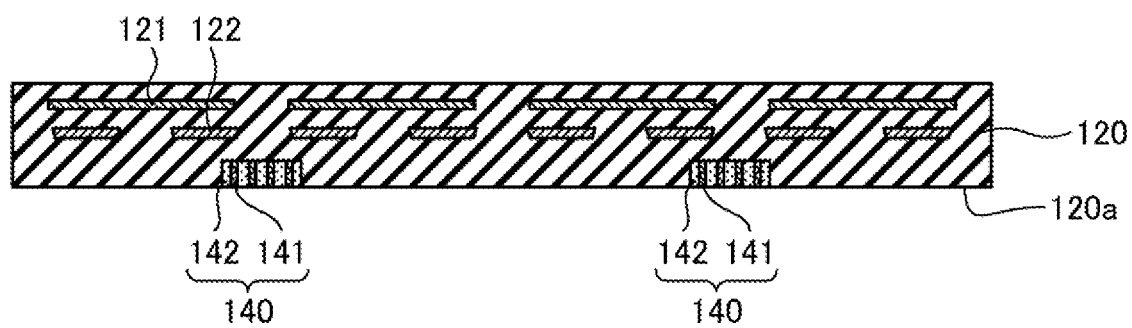
FIG. 8 shows a specific example of a thermal conduction member arranging process.

When the concave portion 120c is formed, a thermal conduction member 140 is arranged in the concave portion 120c (step S104). Specifically, for example, as shown in FIG. 8, the thermal conduction member 140 having a cylindrical shape with substantially the same diameter as that of the concave portion 120c is fitted in the concave portion 120c. FIG. 8 shows a specific example of a thermal conduction member arranging process. The thermal conduction member 140 is arranged in the concave portion 120c such that the longitudinal direction of carbon nanotubes 141 coincides with a stack direction of the base plate 110 and the ceramic plate 120 (in other words, the thickness direction of the ceramic plate 120). At this time, the carbon nanotubes 141 penetrate through a resin 142 in the thickness direction, upper end faces of the carbon nanotubes 141 are in contact with a bottom surface of the concave portion 120c, and lower end faces of the carbon nanotubes 141 are exposed from the lower surface 120a side of the ceramic plate 120. The thermal conduction member 140 is arranged in the concave portion 120c, resulting in the ceramic plate 120 in which thermal anisotropy by the thermal conduction member 140 is locally imparted on the adhesive surface (i.e., lower surface 120a) side.

Such ceramic substrate 120 is bonded to the base plate 110 by an adhesive layer 130 (step S105). Specifically, the lower surface 120a of the ceramic plate 120 in which the thermal conduction member 140 is arranged is bonded to an upper surface 110a of the base plate 110 by the adhesive layer 130. At this time, the lower end faces of the carbon nanotubes 141 exposed from the lower surface 120a side of the ceramic plate 120 are connected to the upper surface 110a of the base plate 110 via the adhesive layer 130, so that the upper surface 110a of the base plate 110 and the bottom surface of the concave portion 120c are in thermally conductive communication with each other. This makes it possible to smoothly transfer heat from the hot spot corresponding to the concave portion 120c to the base plate 110. By bonding the ceramic plate 120 to the base plate 110, the substrate fixing device 100 is completed. Note that the upper and lower end faces of the carbon nanotubes 141 may be buried in the resin 142 or the adhesive layer 130.

As described above, a substrate fixing device (e.g., substrate fixing device 100) according to the first embodiment includes a base plate (e.g., base plate 110), a ceramic plate (e.g., ceramic plate 120), and a thermal conduction member (e.g., thermal conduction member 140). The ceramic plate is bonded to the base plate via an adhesive layer (e.g., adhesive layer 130), has an electrode (e.g., heater electrode 122) embedded therein for generating heat, and adsorbs a substrate (e.g., wafer) by electrostatic force. The thermal conduction member is arranged in an adhesive surface (e.g., lower surface 120a) of the ceramic plate, and has thermal conductivity in the stack direction of the base plate and the ceramic plate higher than thermal conductivity in the plane direction perpendicular to the stack direction. Thereby, according to the substrate fixing device of the first embodiment, the sufficiently high thermal uniformity can be obtained.

In addition, the thermal conduction member may be arranged at a position overlapping a hot spot, which becomes a temperature singularity when the electrode generates heat, on the adsorption surface (e.g., upper surface 120b) of the ceramic plate, in a plan view. Thereby, according to the substrate fixing device of the first embodiment, since the hot spot can be cooled in a pinpoint manner by the base plate, the temperature difference on the adsorption surface of the ceramic plate can be further reduced.

Further, the adhesive surface of the ceramic plate may be formed with a concave portion (for example, concave portion 120c), in correspondence to the position of the hot spot. The thermal conduction member may also be arranged in the concave portion. Thereby, according to the substrate fixing device of the first embodiment, since the hot spot can be cooled in a pinpoint manner by the base plate, the temperature difference on the adsorption surface of the ceramic plate can be further reduced.

Further, the thermal conduction member may include carbon nanotubes (e.g., carbon nanotubes 141) and a resin (e.g., resin 142). The carbon nanotubes may be arranged such that the longitudinal direction faces toward the stack direction. The resin may cover the carbon nanotubes in a state in which both end faces of the carbon nanotubes in the longitudinal direction are exposed. Thereby, according to the substrate fixing device of the first embodiment, it is possible to smoothly transfer heat along the stack direction of the base plate and the ceramic plate.

Second Embodiment

A second embodiment relates to a variation in the arrangement of the thermal conduction member 140 of the first embodiment.

Figure 9:
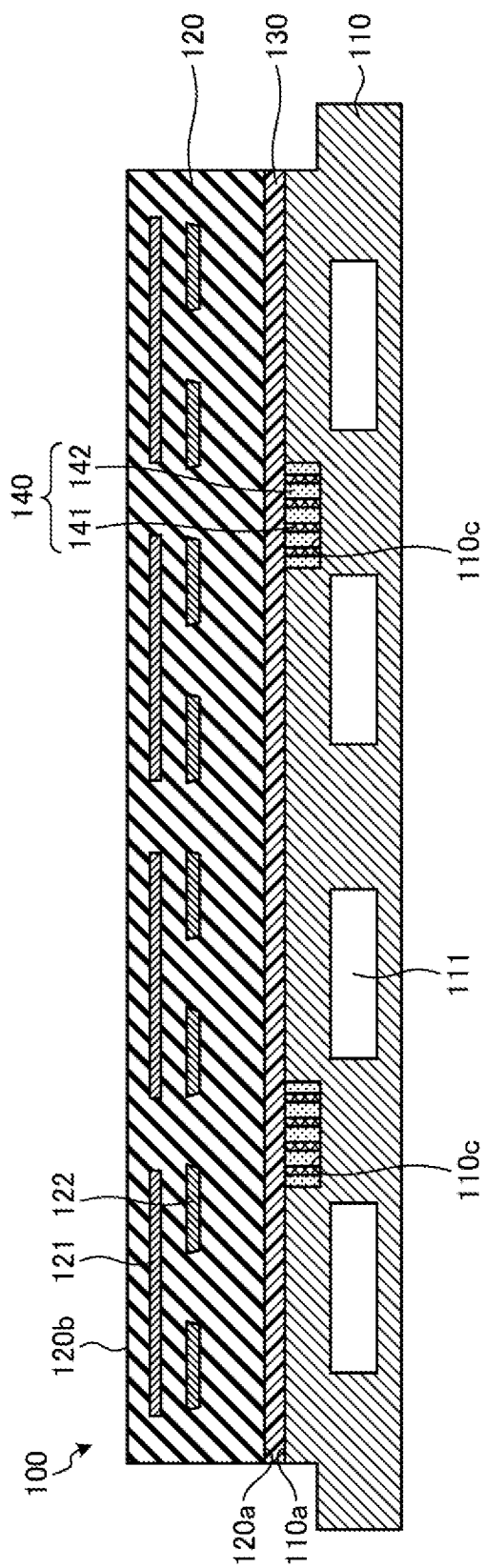
FIG. 9 is a schematic view showing a cross section of a substrate fixing device according to a second embodiment.

FIG. 9 is a schematic view showing a cross section of the substrate fixing device 100 according to the second embodiment. In FIG. 9, the same parts as those in FIG. 2 are denoted with the same reference signs.

In the substrate fixing device 100 shown in FIG. 9, the thermal conduction member 140 is arranged in the adhesive surface (i.e., upper surface 110a) of the base plate 110, instead of the adhesive surface (i.e., lower surface 120a) of the ceramic plate 120. That is, a concave portion 110c is formed in the upper surface 110a of the base plate 110, not in the lower surface 120a of the ceramic plate 120, and the thermal conduction member 140 is arranged in the concave portion 110c. In this way, even when the thermal conduction member 140 is arranged in the upper surface 110a of the base plate 110, instead of the lower surface 120a of the ceramic plate 120, heat can be smoothly transferred from the ceramic plate 120 to the base plate 110, as compared with a case in which a resin for temperature control is arranged. For this reason, it is possible to suppress generation of a hot spot on the adsorption surface (i.e., upper surface 120b) of the ceramic plate 120 where a temperature is higher than those of other regions. As a result, a temperature distribution on the adsorption surface of the ceramic plate 120 can be made uniform, and therefore, sufficiently high thermal uniformity can be obtained.

Figure 10:
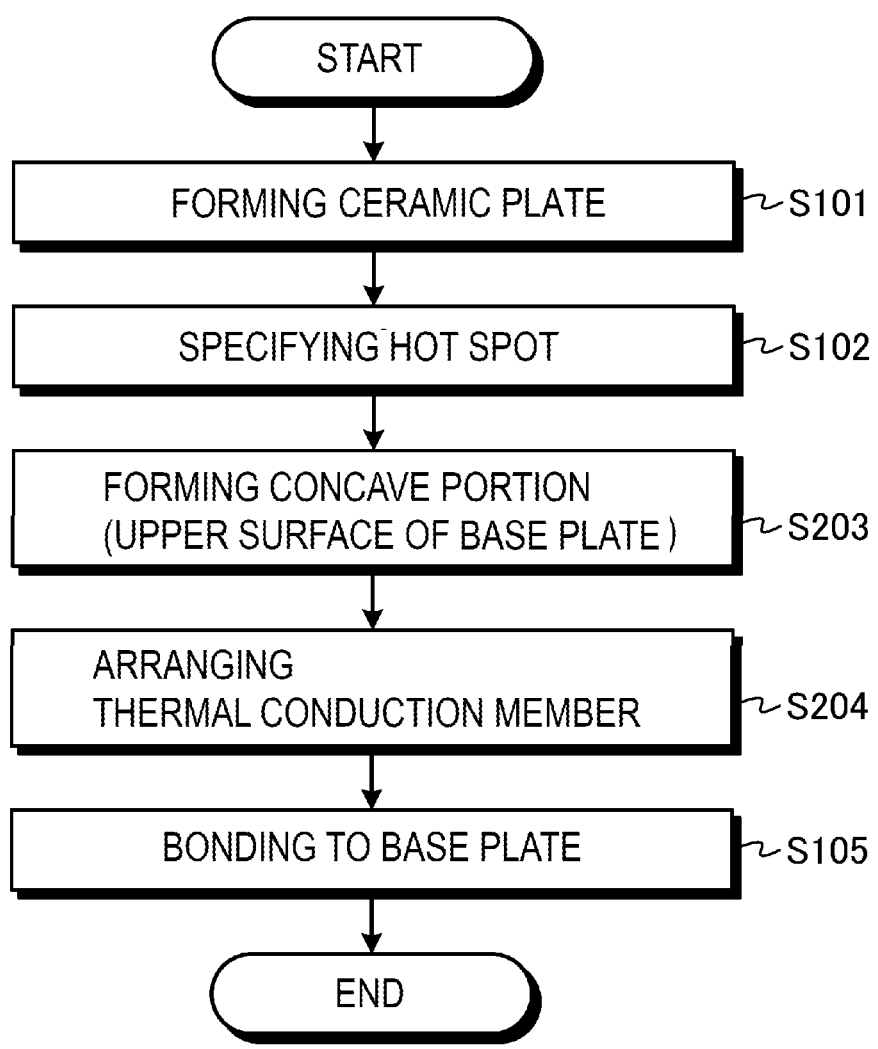
FIG. 10 is a flowchart showing a manufacturing method of the substrate fixing device according to the second embodiment.

Next, a manufacturing method of the substrate fixing device 100 configured as described above will be described with reference to FIG. 10. FIG. 10 is a flowchart showing a manufacturing method of the substrate fixing device 100 according to the second embodiment. In the processing illustrated in FIG. 10, the processing denoted with the same reference numerals as those in FIG. 4 is similar to the processing described with reference to FIG. 4, and therefore, detailed descriptions thereof are omitted.

Figure 11:
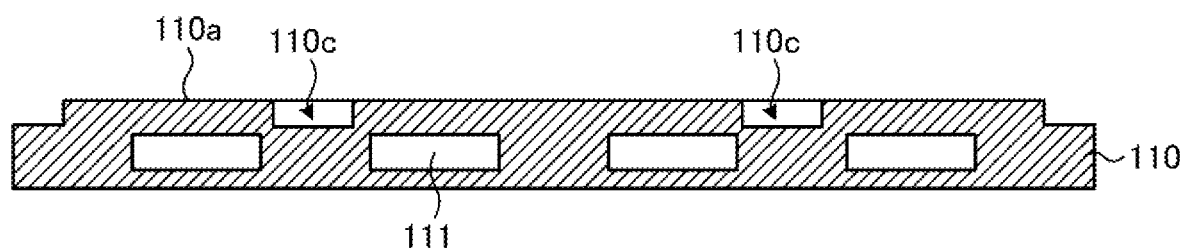
FIG. 11 shows a specific example of a concave portion forming process.

When the hot spot is specified in step S102, the adhesive surface (i.e., upper surface 110a) of the base plate 110 is formed with a concave portion, in correspondence to a position of the hot spot (step S203). Specifically, as shown in FIG. 11, for example, the base plate 110 is cut from the upper surface 110a side to a position that does not reach the refrigerant passage 111, resulting in the formation of the concave portion 110c. FIG. 11 shows a specific example of a concave portion forming process. The concave portion 110c is formed by laser processing or drilling, for example.

Figure 12:
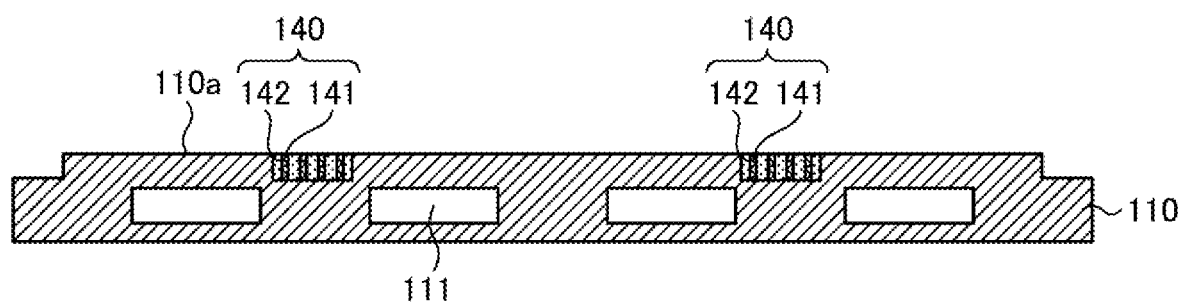
FIG. 12 shows a specific example of a thermal conduction member arranging process.

When the concave portion 110c is formed, the thermal conduction member 140 is arranged in the concave portion 110c (step S204). Specifically, for example, as shown in FIG. 12, the thermal conduction member 140 having a cylindrical shape with substantially the same diameter as that of the concave portion 110c is fitted in the concave portion 110c. FIG. 12 shows a specific example of a thermal conduction member arranging process. The thermal conduction member 140 is arranged in the concave portion 110c such that the longitudinal direction of the carbon nanotubes 141 coincides with the stack direction of the base plate 110 and the ceramic plate 120 (in other words, the thickness direction of the base plate 110). At this time, the carbon nanotubes 141 penetrate through the resin 142 in the thickness direction, the lower end faces of the carbon nanotubes 141 are in contact with a bottom surface of the concave portion 110c, and the upper end faces of the carbon nanotubes 141 are exposed from the upper surface 110a side of the base plate 110. The thermal conduction member 140 is arranged in the concave portion 110c, resulting in the base plate 110 in which thermal anisotropy by the thermal conduction member 140 is locally imparted on the adhesive surface (i.e., upper surface 110a) side.

The ceramic plate 120 is bonded to the base plate 110 by the adhesive layer 130 (step S205). Specifically, the lower surface 120a of the ceramic plate 120 is bonded to the upper surface 110a of the base plate 110, in which the thermal conduction member 140 is arranged, by the adhesive layer 130. At this time, the upper end faces of the carbon nanotubes 141 exposed from the upper surface 110a side of the base plate 110 are connected to the lower surface 120a of the ceramic plate 120 via the adhesive layer 130, so that the lower surface 120a of the ceramic plate 120 and the bottom surface of the concave portion 110c are in thermally conductive communication with each other. This makes it possible to smoothly transfer heat from the hot spot corresponding to the concave portion 110c to the base plate 110. By bonding the ceramic plate 120 to the base plate 110, the substrate fixing device 100 is completed. Note that the upper and lower end faces of the carbon nanotubes 141 may be buried in the resin 142 or the adhesive layer 130.

As described above, in the substrate fixing device according to the second embodiment, the thermal conduction member is arranged in the adhesive surface (e.g., upper surface 110a) of the base plate. Thereby, according to the substrate fixing device of the second embodiment, the sufficiently high thermal uniformity can be obtained.

Further, the adhesive surface of the base plate may be formed with a concave portion (e.g., concave portion 110c), in correspondence to the position of the hot spot. The thermal conduction member may also be arranged in the concave portion. Thereby, according to the substrate fixing device of the second embodiment, since the hot spot can be cooled in a pinpoint manner by the base plate, the temperature difference on the adsorption surface of the ceramic plate can be further reduced.

Third Embodiment

A third embodiment relates to a variation in the arrangement of the thermal conduction member 140 of the first embodiment.

Figure 13:
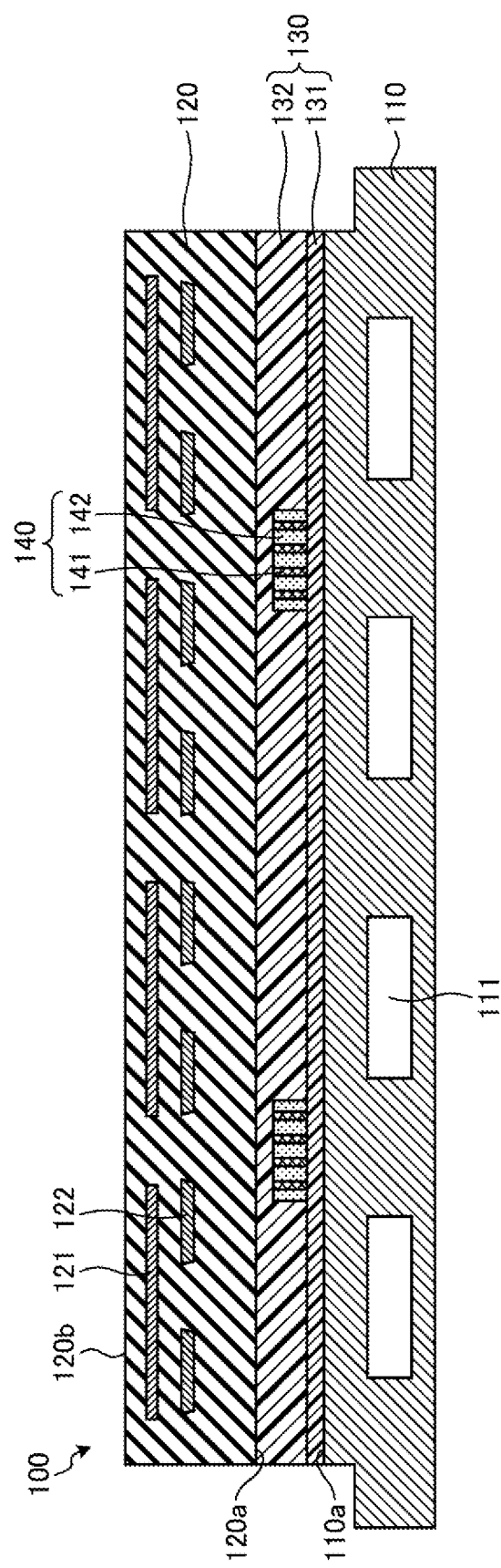
FIG. 13 is a schematic view showing a cross section of a substrate fixing device according to a third embodiment.

FIG. 13 is a schematic view showing a cross section of the substrate fixing device 100 according to the third embodiment. In FIG. 13, the same parts as those in FIG. 2 are denoted with the same reference signs.

In the substrate fixing device 100 shown in FIG. 13, the thermal conduction member 140 is arranged in an inside of the adhesive layer 130, instead of the adhesive surface (i.e., lower surface 120a) of the ceramic plate 120. In this way, even when the thermal conduction member 140 is arranged in the inside of the adhesive layer 130, instead of the lower surface 120a of the ceramic plate 120, heat can be smoothly transferred from the ceramic plate 120 to the base plate 110, as compared with a case in which a resin for temperature control is arranged. For this reason, it is possible to suppress generation of a hot spot on the adsorption surface (i.e., upper surface 120b) of the ceramic plate 120 where a temperature is higher than those of other regions. As a result, a temperature distribution on the adsorption surface of the ceramic plate 120 can be made uniform, and therefore, sufficiently high thermal uniformity can be obtained.

The adhesive layer 130 has a first adhesive 131 and a second adhesive 132. The first adhesive 131 has a sheet shape and is stacked on the entire surface of the adhesive surface (i.e., upper surface 110a) of the base plate 110 to bond the thermal conduction member 140 thereto. The second adhesive 132 is stacked between the first adhesive 131 and the adhesive surface (i.e., lower surface 120a) of the ceramic plate 120, and covers the thermal conduction member 140. The second adhesive 132 may be made of the same resin as a resin constituting the first adhesive 131 or may be made of a resin different from the resin constituting the first adhesive 131. In this way, the first adhesive 131 is stacked on the entire surface of the upper surface 110a of the base plate 110, and the thermal conduction member 140 to which the first adhesive 131 adheres is covered with the second adhesive 132, so that a position of the thermal conduction member 140 is fixed in the adhesive layer 130. For this reason, the thermal conduction member 140 is arranged in the inside of the adhesive layer 130 without going through the process of forming a concave portion in the adhesive surface (i.e., lower surface 120a) of the ceramic plate 120. That is, the thermal conduction member 140 can be arranged in the inside of the adhesive layer 130 through a simple process, and therefore, the manufacturing efficiency of the substrate fixing device 100 can be improved.

Figure 14:
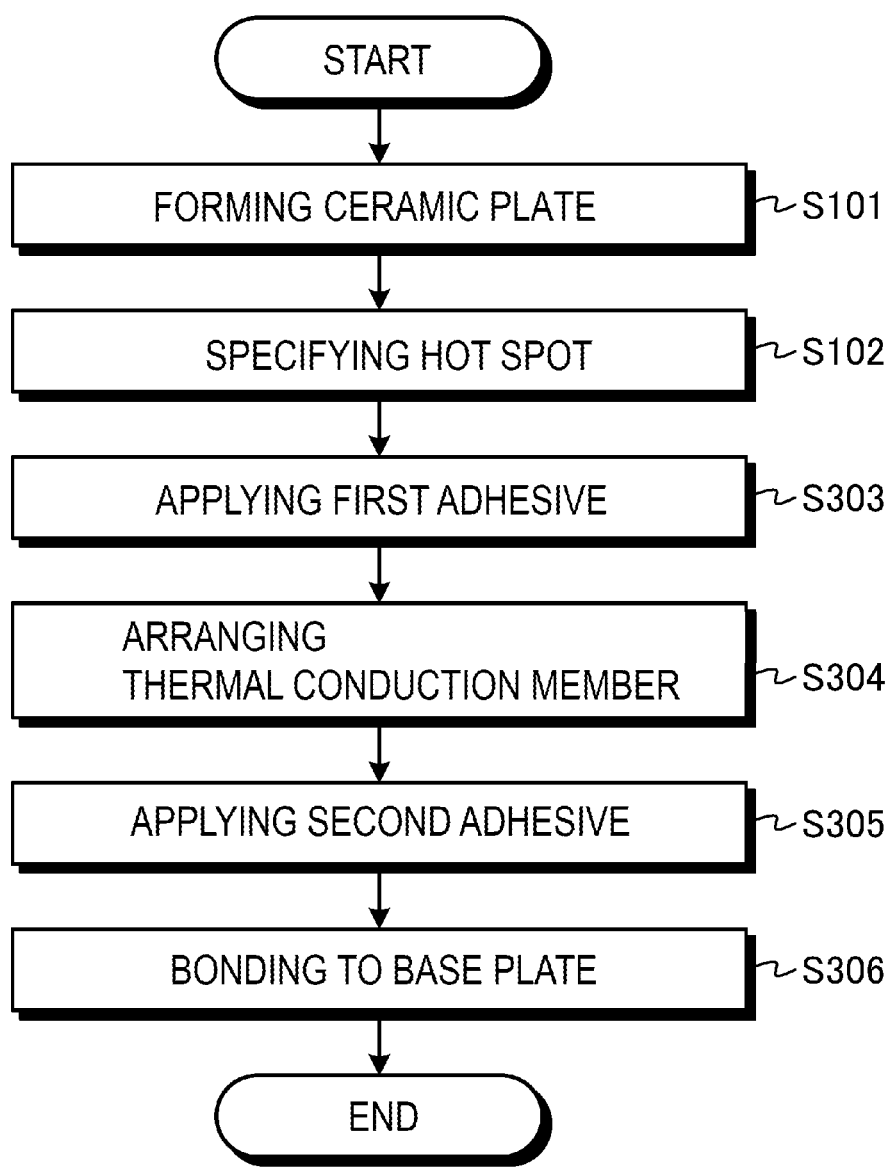
FIG. 14 is a flowchart showing a manufacturing method of the substrate fixing device according of the third embodiment.

Next, a manufacturing method of the substrate fixing device 100 configured as described above will be described with reference to FIG. 14. FIG. 14 is a flowchart showing a manufacturing method of the substrate fixing device 100 according of the third embodiment. In the processing illustrated in FIG. 14, the processing denoted with the same reference numerals as those in FIG. 4 is similar to the processing described with reference to FIG. 4, and therefore, detailed descriptions thereof are omitted.

Figure 15:
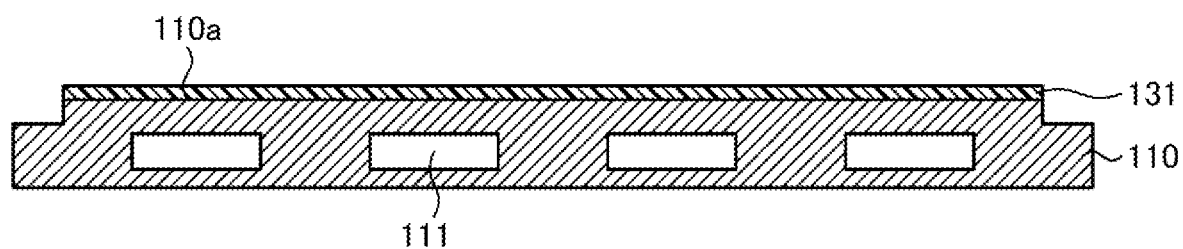
FIG. 15 shows a specific example of a first adhesive applying process.

When the hot spot is specified in step S102, the first adhesive is applied to the entire surface of the adhesive surface (i.e., upper surface 110a) of the base plate 110 (step S303). Specifically, for example, as shown in FIG. 15, the first adhesive 131 is applied to the entire surface of the upper surface 110a of the base plate 110. FIG. 15 shows a specific example of a first adhesive applying process. At the point of time when the first adhesive 131 is applied to the entire surface of the upper surface 110a of the base plate 110, the resin constituting the first adhesive 131 is in a semi-cured state.

Figure 16:
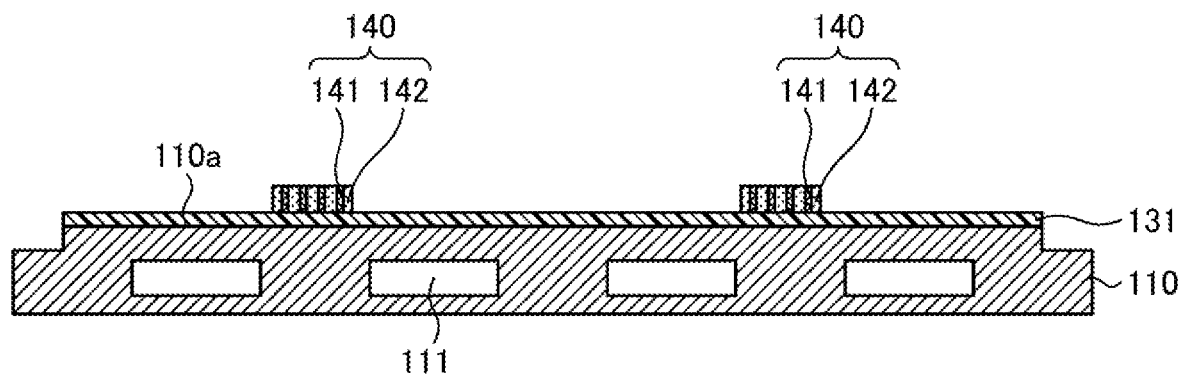
FIG. 16 shows a specific example of a thermal conduction member arranging process.

When the first adhesive 131 is applied, the thermal conduction member 140 is arranged on the first adhesive 131, in correspondence to the position of the hot spot (step S304). Specifically, for example, as shown in FIG. 16, the thermal conduction member 140 having a cylindrical shape with substantially the same diameter as a width of the hot spot is arranged on the first adhesive 131. FIG. 16 shows a specific example of a thermal conduction member arranging process. The thermal conduction member 140 is arranged on the first adhesive 131 such that the longitudinal direction of the carbon nanotubes 141 coincides with the stack direction of the base plate 110 and the ceramic plate 120 (in other words, the thickness direction of the base plate 110). At this time, the carbon nanotubes 141 penetrate through the resin 142 in the thickness direction, the lower end faces of the carbon nanotubes 141 are in contact with the first adhesive 131, and the upper end faces of the carbon nanotubes 141 are exposed from an upper surface of the resin 142.

Figure 17:
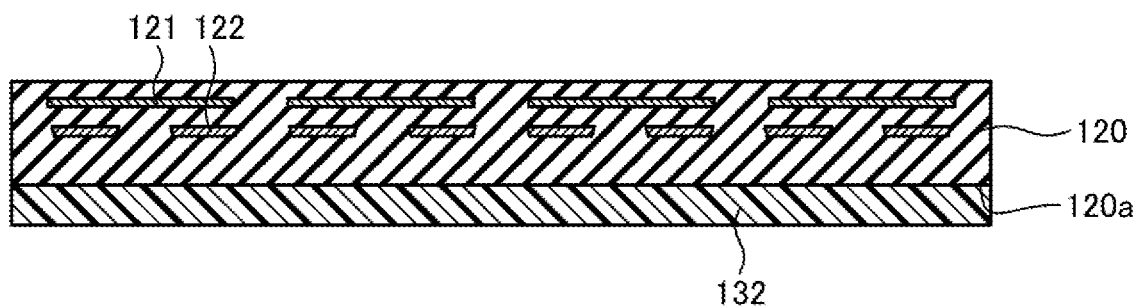
FIG. 17 shows a specific example of a second adhesive applying process.

Then, the second adhesive is applied to the adhesive surface (i.e., lower surface 120a) of the ceramic plate 120 (step S305). Specifically, for example, as shown in FIG. 17, the second adhesive 132 is applied to the entire surface of the lower surface 120a of the ceramic plate 120. FIG. 17 shows a specific example of a second adhesive applying process. At the point of time when the second adhesive 132 is applied to the entire surface of the lower surface 120a of the ceramic plate 120, the resin constituting the second adhesive 132 is in a semi-cured state.

When the second adhesive 132 is applied, the ceramic plate 120 is bonded to the base plate 110 by the adhesive layer 130 composed of the first adhesive 131 and the second adhesive 132 and covering the thermal conduction member 140 (step S306). Specifically, the semi-cured second adhesive 132 is stacked on the semi-cured first adhesive 131 to cover the thermal conduction member 140, and the first adhesive 131 and the second adhesive 132 are cured by heating and pressurization. As a result, the thermal conduction member 140 is arranged in the inside of the adhesive layer 130 composed of the first adhesive 131 and the second adhesive 132, and the lower surface 120a of the ceramic plate 120 is bonded to the upper surface 110a of the base plate 110 by the adhesive layer 130. At this time, the upper end faces of the carbon nanotubes 141 exposed from the upper surface of the resin 142 are connected to the lower surface 120a of the ceramic plate 120 via the second adhesive 132, and therefore, are in thermally conductive communication with the lower surface 120a of the ceramic plate 120. This makes it possible to smoothly transfer heat from the hot spot to the base plate 110. By bonding the ceramic plate 120 to the base plate 110, the substrate fixing device 100 is completed. Note that the upper and lower end faces of the carbon nanotubes 141 may be buried in the resin 142 or the adhesive layer 130.

As described above, in the substrate fixing device according to the third embodiment, the thermal conduction member is arranged in an inside of an adhesive layer (e.g., adhesive layer 130). Thereby, according to the substrate fixing device according to the third embodiment, the sufficiently high thermal uniformity can be obtained.

In addition, the adhesive layer may include a first adhesive (for example, first adhesive 131) and a second adhesive (for example, second adhesive 132). The first adhesive may be stacked on the entire surface of the adhesive surface of the base plate to bond the thermal conduction member thereto. The second adhesive may be stacked between the first adhesive and the adhesive surface of the ceramic plate, and cover the thermal conduction member. Thereby, according to the substrate fixing device according to the third embodiment, the process of forming a concave portion for arranging the heat conductive member therein can be omitted, and therefore, the manufacturing efficiency can be improved.

Note that, in the substrate fixing device 100 according to the third embodiment, the position of the first adhesive 131 and the position of the second adhesive 132 may be interchanged. That is, the first adhesive 131 may be stacked on the entire surface of the adhesive surface (i.e., lower surface 120a) of the ceramic plate 120 to bond the thermal conduction member 140 thereto. In addition, the second adhesive 132 may be stacked between the first adhesive 131 and the adhesive surface (i.e., upper surface 110a) of the base plate, and cover the thermal conduction member 140.

Fourth Embodiment

A fourth embodiment relates to a variation in the structure of the thermal adhesive layer 130 of the third embodiment.

Figure 18:
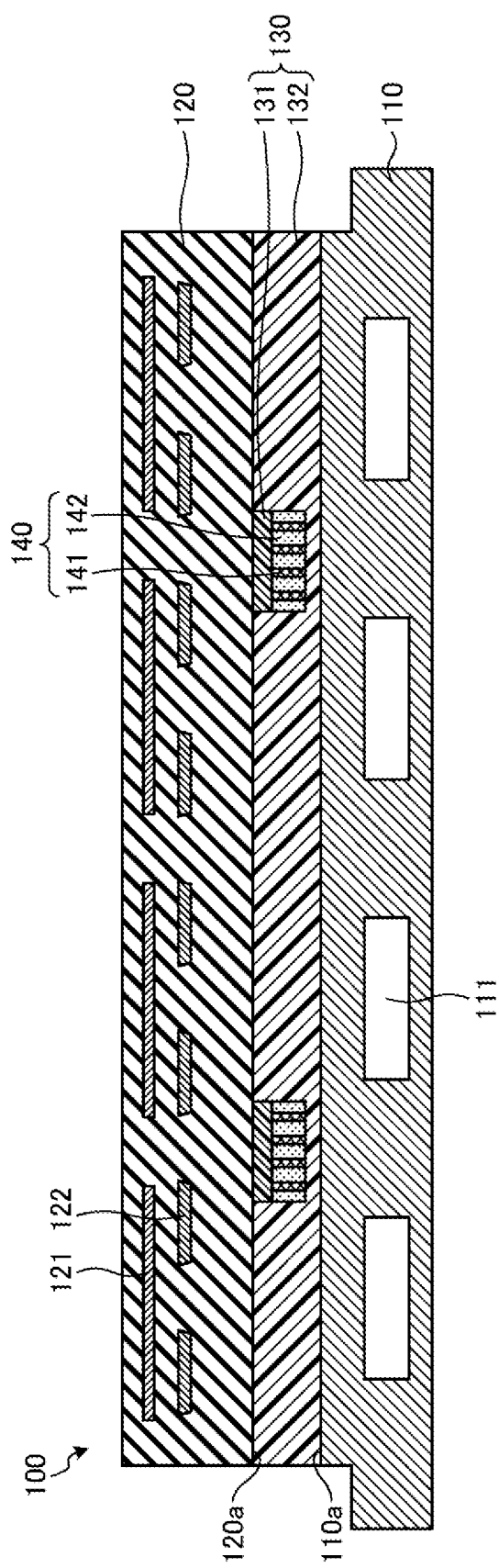
FIG. 18 is a schematic view showing a cross section of a substrate fixing device according to a fourth embodiment.

FIG. 18 is a schematic view showing a cross section of the substrate fixing device 100 according to the fourth embodiment. In FIG. 18, the same parts as those in FIG. 13 are denoted with the same reference signs.

In the substrate fixing device 100 shown in FIG. 18, the adhesive layer 130 includes a first adhesive 131 and a second adhesive 132. The first adhesive 131 has a pad shape and bonds the thermal conduction member 140 to the adhesive surface (i.e., lower surface 120a) of the ceramic plate 120. The second adhesive 132 is stacked between the adhesive surface (i.e., upper surface 110a) of the base plate 110 and the adhesive surface (i.e., lower surface 120a) of the ceramic plate 120, and covers the thermal conduction member 140 and the first adhesive 131. The second adhesive 132 may be made of the same resin as a resin constituting the first adhesive 131 or may be made of a resin different from the resin constituting the first adhesive 131. In this way, the thermal conduction member 140 is bonded to the lower surface 120a of the ceramic plate 120 via the first adhesive 131, and the thermal conduction member 140 and the first adhesive 131 are covered with the second adhesive 132, so that the position of the thermal conduction member 140 is fixed in the adhesive layer 130. For this reason, the thermal conduction member 140 is arranged in the inside of the adhesive layer 130 without going through the process of forming a concave portion in the adhesive surface (i.e., lower surface 120a) of the ceramic plate 120. That is, the thermal conduction member 140 can be arranged in the inside of the adhesive layer 130 through a simple process, and therefore, the manufacturing efficiency of the substrate fixing device 100 can be improved.

Figure 19:
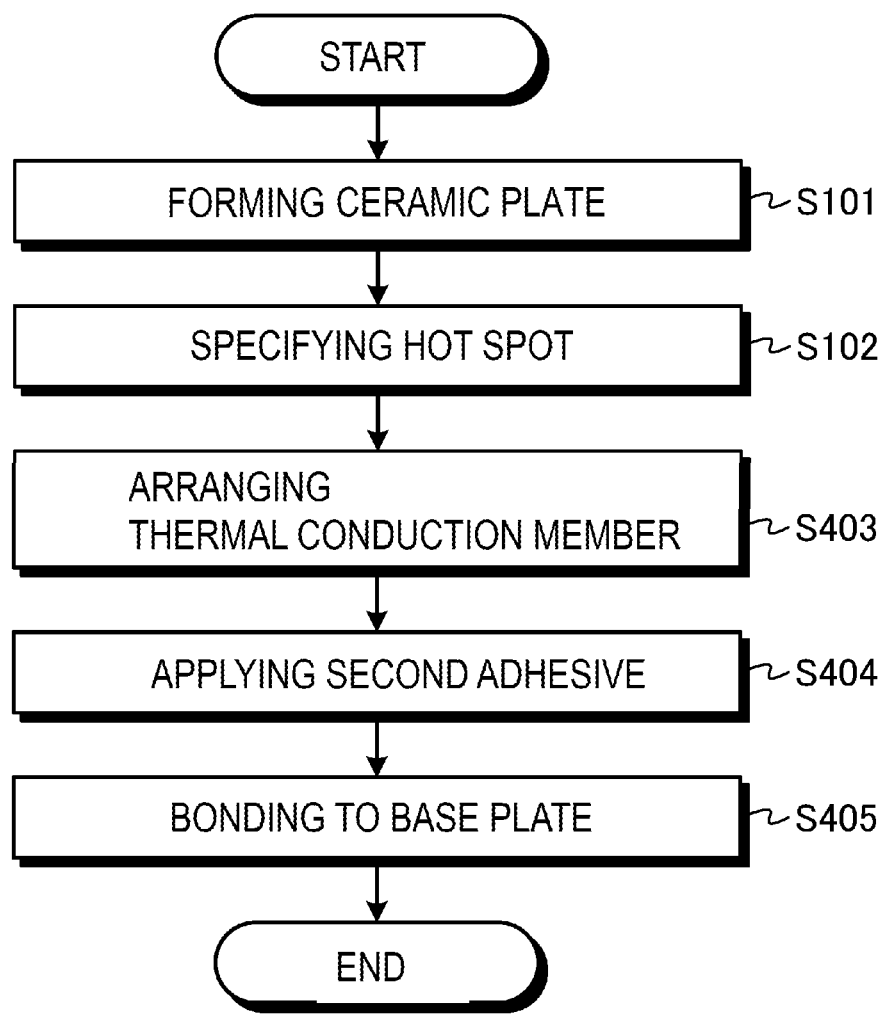
FIG. 19 is a flowchart showing a manufacturing method of the substrate fixing device according of the fourth embodiment.

Next, a manufacturing method of the substrate fixing device 100 configured as described above will be described with reference to FIG. 19. FIG. 19 is a flowchart showing a manufacturing method of the substrate fixing device 100 according of the fourth embodiment. In the processing illustrated in FIG. 19, the processing denoted with the same reference numerals as those in FIG. 14 is similar to the processing described with reference to FIG. 14, and therefore, detailed descriptions thereof are omitted.

When the hot spot is specified in step S102, the thermal conduction member 140 is bonded to a position, which corresponds to the hot spot, on the adhesive surface (i.e., lower surface 120a) of the ceramic plate 120 (step S403).

Figure 20:
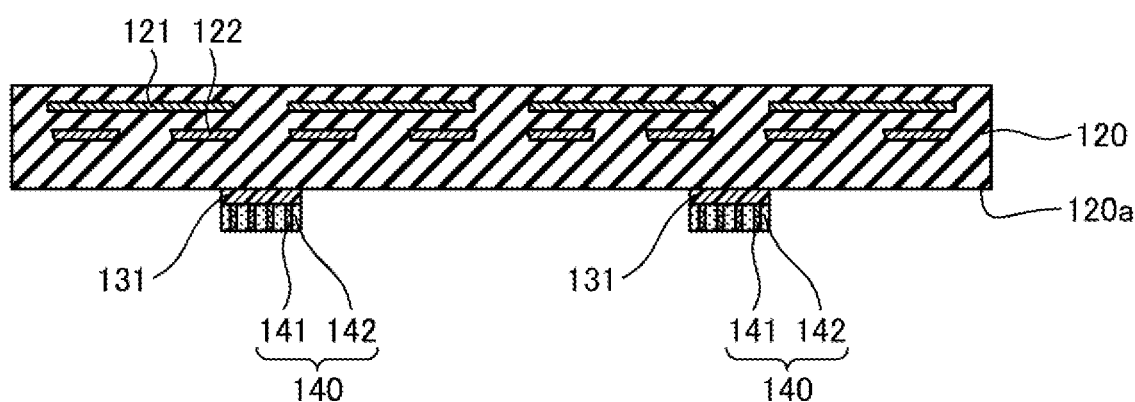
FIG. 20 shows a specific example of a thermal conduction member bonding process.

Specifically, for example, as shown in FIG. 20, the thermal conduction member 140 having a cylindrical shape with substantially the same diameter as a width of the hot spot is bonded to the lower surface 120a of the ceramic plate 120 via the first adhesive 131. FIG. 20 shows a specific example of a thermal conduction member bonding process. At the point of time when the thermal conduction member 140 is bonded to the lower surface 120a of the ceramic plate 120, the resin constituting the first adhesive 131 is in a semi-cured state. The thermal conduction member 140 is bonded to the lower surface 120a of the ceramic plate 120 such that the longitudinal direction of the carbon nanotubes 141 coincides with the stack direction of the base plate 110 and the ceramic plate 120 (in other words, the thickness direction of the ceramic plate 120). At this time, the carbon nanotubes 141 penetrate through the resin 142 in the thickness direction, the upper end faces of the carbon nanotubes 141 are in contact with the first adhesive 131, and the lower end faces of the carbon nanotubes 141 are exposed from a lower surface of the resin 142.

In addition, when the resin constituting the first adhesive 131 and the resin constituting the second adhesive 132 are different from each other, the first adhesive 131 preferably has thermal conductivity higher than that of the second adhesive 132. This makes it possible to smoothly transfer heat from the ceramic plate 120 to the thermal conduction member 140.

Figure 21:
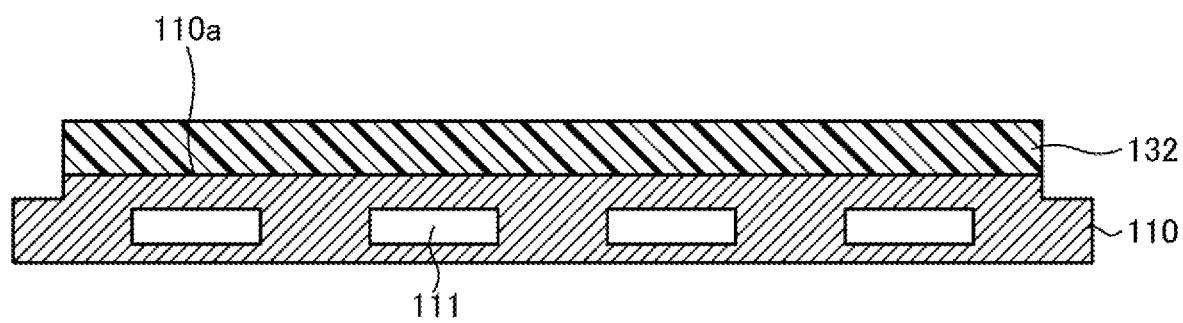
FIG. 21 shows a specific example of a second adhesive applying process.

Then, the second adhesive is applied to the adhesive surface (i.e., upper surface 110a) of the base plate 110 (step S404). Specifically, for example, as shown in FIG. 21, the second adhesive 132 is applied to the entire surface of the upper surface 110a of the base plate 110. FIG. 21 shows a specific example of a second adhesive applying process. At the point of time when the second adhesive 132 is applied to the entire surface of the upper surface 110a of the base plate 110, the resin constituting the second adhesive 132 is in a semi-cured state.

When the second adhesive 132 is applied, the ceramic plate 120 is bonded to the base plate 110 by the adhesive layer 130 composed of the first adhesive 131 and the second adhesive 132 and covering the thermal conduction member 140 (step S405). The second adhesive 132 in a semi-cured state is stacked on the lower surface 120a of the ceramic plate 120 to cover the thermal conduction member 140 and the first adhesive 131, and the first adhesive 131 and the second adhesive 132 are cured by heating and pressurization. As a result, the thermal conduction member 140 is arranged in the inside of the adhesive layer 130 composed of the first adhesive 131 and the second adhesive 132, and the lower surface 120a of the ceramic plate 120 is bonded to the upper surface 110a of the base plate 110 by the adhesive layer 130. At this time, the lower end faces of the carbon nanotubes 141 exposed from the lower surface of the resin 142 are connected to the upper surface 110a of the base plate 110 via the second adhesive 132, and therefore, are in thermally conductive communication with the upper surface 110a of the base plate 110. This makes it possible to smoothly transfer heat from the hot spot to the base plate 110. By bonding the ceramic plate 120 to the base plate 110, the substrate fixing device 100 is completed. Note that the upper and lower end faces of the carbon nanotubes 141 may be buried in the resin 142 or the adhesive layer 130.

As described above, in the substrate fixing device according to the fourth embodiment, the adhesive layer includes the first adhesive (e.g., first adhesive 131) and the second adhesive (e.g., second adhesive 132). The first adhesive has a pad shape and bonds the thermal conduction member to the adhesive surface of the ceramic plate. The second adhesive is stacked between the adhesive surface of the base plate and the adhesive surface of the ceramic plate, and covers the thermal conduction member and the first adhesive. Thereby, according to the substrate fixing device according to the fourth embodiment, the process of forming a concave portion for arranging the heat conductive member therein can be omitted, and therefore, the manufacturing efficiency can be improved.

In addition, the first adhesive may have thermal conductivity higher than that of the second adhesive. Thereby, according to the substrate fixing device according to the fourth embodiment, it is possible to smoothly transfer heat from the ceramic plate to the thermal conduction member.

Note that, in the substrate fixing device according to the fourth embodiment, the pad-shaped first adhesive 131 may bond the thermal conduction member 140 to the adhesive surface (i.e., upper surface 110a) of the base plate 110, instead of the adhesive surface (i.e., lower surface 120a) of the ceramic plate 120.

Other Modified Embodiments

In the above embodiments, the case where the heat conductive member 140 is arranged in the adhesive surface of the ceramic plate 120, the adhesive surface of the base plate 110, or the inside of the adhesive layer 130 has been described as an example. However, the arrangement position of the heat conductive member 140 can be changed as appropriate. For example, the thermal conduction member 140 may be arranged in any two of the adhesive surface of the ceramic plate 120, the adhesive surface of the base plate 110, and the inside of the adhesive layer 130. Further, the thermal conduction member 140 may be arranged in the adhesive surface of the ceramic plate 120, the adhesive surface of the base plate 110, and the inside of the adhesive layer 130. In short, the thermal conduction member 140 may be arranged in at least one of the adhesive surface of the ceramic plate 120, the adhesive surface of the base plate 110, and the inside of the adhesive layer 130.

This disclosure further encompasses various exemplary embodiments, for example, described below.

[1] A manufacturing method of a substrate fixing device, the manufacturing method comprising:
forming a ceramic plate having an electrode embedded therein for generating heat,
specifying a hot spot, which becomes a temperature singularity when the electrode generates heat, on an adsorption surface of the ceramic plate capable of adsorbing a substrate;
forming at least one of an adhesive surface of the ceramic plate and an adhesive surface of a base plate with a concave portion, in correspondence to a position of the hot spot,
arranging, in the concave portion, a thermal conduction member having thermal conductivity in a stack direction of the base plate and the ceramic plate higher than thermal conductivity in a plane direction perpendicular to the stack direction; and
bonding the adhesive surface of the ceramic plate to the adhesive surface of the base plate via an adhesive layer.

[2] A manufacturing method of a substrate fixing device, the manufacturing method comprising:
forming a ceramic plate having an electrode embedded therein for generating heat;
specifying a hot spot, which becomes a temperature singularity when the electrode generates heat, on an adsorption surface of the ceramic plate capable of adsorbing a substrate;
applying a first adhesive to an entire surface of one of an adhesive surface of the ceramic plate and an adhesive surface of a base plate;
arranging a thermal conduction member, which has thermal conductivity in a stack direction of the base plate and the ceramic plate higher than thermal conductivity in a plane direction perpendicular to the stack direction, on the first adhesive, in correspondence to a position of the hot spot;
applying a second adhesive to the other of the adhesive surface of the ceramic plate and the adhesive surface of the base plate; and
stacking the second adhesive on the first adhesive to cover the thermal conduction member and bonding the adhesive surface of the ceramic plate to the adhesive surface of the base plate via an adhesive layer having the first adhesive and the second adhesive.

[3] A manufacturing method of a substrate fixing device, the manufacturing method comprising:
forming a ceramic plate having an electrode embedded therein for generating heat;
specifying a hot spot, which becomes a temperature singularity when the electrode generates heat, on an adsorption surface of the ceramic plate capable of adsorbing a substrate;
bonding, via a pad-shaped first adhesive, a thermal conduction member, which has thermal conductivity in a stack direction of the ceramic plate and a base plate higher than thermal conductivity in a plane direction perpendicular to the stack direction, to one of an adhesive surface of the ceramic plate and an adhesive surface of the base plate at a position corresponding to a position of the hot spot;
applying a second adhesive to the other of the adhesive surface of the ceramic plate and the adhesive surface of the base plate; and
stacking the second adhesive on the one adhesive surface to cover the thermal conduction member and the first adhesive and bonding the adhesive surface of the ceramic plate to the adhesive surface of the base plate via an adhesive layer having the first adhesive and the second adhesive.

What is claimed is:
1. A substrate fixing device comprising:
a base plate;
a ceramic plate bonded to the base plate via an adhesive layer, the ceramic plate configured to adsorb a substrate by electrostatic force, the ceramic plate including an electrode embedded therein for generating heat; and
a thermal conduction member arranged in at least one of an adhesive surface of the ceramic plate, an adhesive surface of the base plate, and an inside of the adhesive layer, the thermal conduction member having thermal conductivity in a stack direction of the base plate and the ceramic plate higher than thermal conductivity in a plane direction perpendicular to the stack direction,
wherein the thermal conduction member comprises:
a carbon nanotube arranged such that a longitudinal direction faces toward the stack direction, and
a resin covering the carbon nanotube in a state in which both end surfaces of the carbon nanotube in the longitudinal direction are exposed.

2. The substrate fixing device according to claim 1, wherein the thermal conduction member is arranged at a position overlapping a hot spot, which becomes a temperature singularity when the electrode generates heat, on an adsorption surface of the ceramic plate, in a plan view.

3. The substrate fixing device according to claim 2, wherein at least one of the adhesive surface of the ceramic plate and the adhesive surface of the base plate is formed with a concave portion, in correspondence to a position of the hot spot, and
    wherein the thermal conduction member is arranged in the concave portion.

4. The substrate fixing device according to claim 1, wherein the adhesive layer comprises:
    a first adhesive stacked on an entire surface of one of the adhesive surface of the ceramic plate and the adhesive surface of the base plate to bond the thermal conduction member thereto, and
    a second adhesive stacked between the first adhesive and the other of the adhesive surface of the ceramic plate and the adhesive surface of the base plate and configured to cover the thermal conduction member.

5. The substrate fixing device according to claim 1, wherein the adhesive layer comprises:
    a pad-shaped first adhesive configured to bond the thermal conduction member to one of the adhesive surface of the ceramic plate and the adhesive surface of the base plate, and
    a second adhesive stacked between the adhesive surface of the ceramic plate and the adhesive surface of the base plate and configured to cover the thermal conduction member and the first adhesive.

6. The substrate fixing device according to claim 5, wherein the first adhesive has thermal conductivity higher than that of the second adhesive.

7. The substrate fixing device according to claim 1, wherein at least one of the adhesive surface of the ceramic plate and the adhesive surface of the base plate is formed with a concave portion, and
    wherein the thermal conduction member is arranged in the concave portion.

* * * * *